US012655523B2

(12) United States Patent
Cong et al.

(10) Patent No.: US 12,655,523 B2
(45) Date of Patent: Jun. 16, 2026

(54) SYSTEM AND METHOD FOR AUTO CORRECTION OF SUBSTRATE MISALIGNMENT

(71) Applicant: Applied Materials, Inc., Santa Clara, CA (US)

(72) Inventors: Zhepeng Cong, San Jose, CA (US); Tao Sheng, Santa Clara, CA (US); Martin Jeffrey Salinas, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 632 days.

(21) Appl. No.: 18/156,102

(22) Filed: Jan. 18, 2023

(65) Prior Publication Data

US 2024/0035162 A1 Feb. 1, 2024

Related U.S. Application Data

(60) Provisional application No. 63/392,796, filed on Jul. 27, 2022.

(51) Int. Cl.
*C23C 16/46* (2006.01)
*C23C 16/44* (2006.01)
(Continued)

(52) U.S. Cl.
CPC .......... *C23C 16/46* (2013.01); *C23C 16/4408* (2013.01); *C23C 16/4583* (2013.01);
(Continued)

(58) Field of Classification Search
CPC . H01L 21/67259; H01L 21/681; C23C 16/52; C23C 16/4585; C23C 16/4583
See application file for complete search history.

(56) References Cited

U.S. PATENT DOCUMENTS

| | | | |
|---|---|---|---|
| 5,489,341 A | 2/1996 | Bergman et al. | |
| 5,761,023 A | 6/1998 | Lue et al. | |

(Continued)

FOREIGN PATENT DOCUMENTS

| | | | |
|---|---|---|---|
| JP | 2003-86566 A | 3/2003 | |
| JP | 2006-049503 A | 2/2006 | |

(Continued)

OTHER PUBLICATIONS

PCT Notification of Transmittal of the International Search Report and the Written Opinion of the International Searching Authority for International Application No. PCT/US2023/011027; dated May 17, 2023.

(Continued)

*Primary Examiner* — Joseph A Miller, Jr.
(74) *Attorney, Agent, or Firm* — Patterson + Sheridan, LLP

(57) ABSTRACT

Embodiments described herein relate semiconductor manufacturing and processing. More particularly, a processing systems for auto correcting misalignments of substrates in process chambers is provided. The processing system includes a process chamber having a substrate support disposed within a chamber volume of the process chamber. The substrate support includes a pocket for receiving a substrate, and a plurality of flow conduits extending between a top surface of the pocket and a bottom surface of the substrate support. An imaging device is coupled to the process chamber and configured to monitor a position of a substrate when loaded in the pocket of the substrate support.

17 Claims, 9 Drawing Sheets

(51) Int. Cl.

| | | |
|---|---|---|
| *C23C 16/458* | (2006.01) |
| *C23C 16/52* | (2006.01) |
| *H10P 72/00* | (2026.01) |
| *H10P 72/50* | (2026.01) |

(52) U.S. Cl.
CPC .......... *C23C 16/52* (2013.01); *H10P 72/0402* (2026.01); *H10P 72/0606* (2026.01); *H10P 72/53* (2026.01)

(56) References Cited

U.S. PATENT DOCUMENTS

| | | | |
|---|---|---|---|
| 6,113,702 | A | 9/2000 | Halpin et al. |
| 6,183,130 | B1 | 2/2001 | Adams et al. |
| 6,454,865 | B1 | 9/2002 | Goodman et al. |
| 6,720,263 | B2 | 4/2004 | Olgado et al. |
| 6,839,507 | B2 | 1/2005 | Adams et al. |
| 6,876,442 | B2 | 4/2005 | Vatus et al. |
| 7,233,841 | B2 | 6/2007 | Sadighi et al. |
| 7,691,204 | B2 | 4/2010 | Chacin et al. |
| 8,057,602 | B2 | 11/2011 | Koelmel et al. |
| 8,726,837 | B2 | 5/2014 | Patalay et al. |
| 8,883,026 | B2 | 11/2014 | Ota et al. |
| 8,883,653 | B2 | 11/2014 | Hashizume |
| 8,955,547 | B2 | 2/2015 | Gungor et al. |
| 9,109,754 | B2 | 8/2015 | Yudovsky et al. |
| 9,259,758 | B2 | 2/2016 | Emoto et al. |
| 9,959,610 | B2 | 5/2018 | Tertitski et al. |
| 2006/0222481 | A1 | 10/2006 | Foree |
| 2007/0022954 | A1 | 2/2007 | Iizuka et al. |
| 2008/0280453 | A1 | 11/2008 | Koelmel et al. |
| 2009/0314205 | A1* | 12/2009 | Patalay .............. G02B 23/2492 118/713 |
| 2010/0075066 | A1 | 3/2010 | Ueda et al. |
| 2013/0098477 | A1* | 4/2013 | Yudovsky ......... C23C 16/45544 137/507 |
| 2013/0256962 | A1 | 10/2013 | Ranish et al. |
| 2014/0065295 | A1* | 3/2014 | Emoto ................ H01L 21/6708 118/52 |
| 2016/0125589 | A1 | 5/2016 | Tertitski et al. |
| 2016/0351426 | A1* | 12/2016 | Kwon .................... C23C 16/46 |
| 2020/0373178 | A1* | 11/2020 | Kim .................. H01L 21/67259 |

FOREIGN PATENT DOCUMENTS

| | | | |
|---|---|---|---|
| JP | 2006049503 | * | 2/2006 |
| KR | 10-2016-0112242 A | | 9/2016 |

OTHER PUBLICATIONS

Office Action in related application KR 10-2025-7005212 dated Aug. 14, 2025.

Japanese Office Action for Application No. 2025-504239 dated Feb. 10, 2026.

* cited by examiner

10
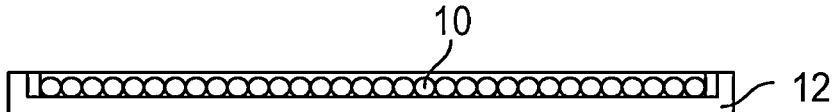
12
14
10
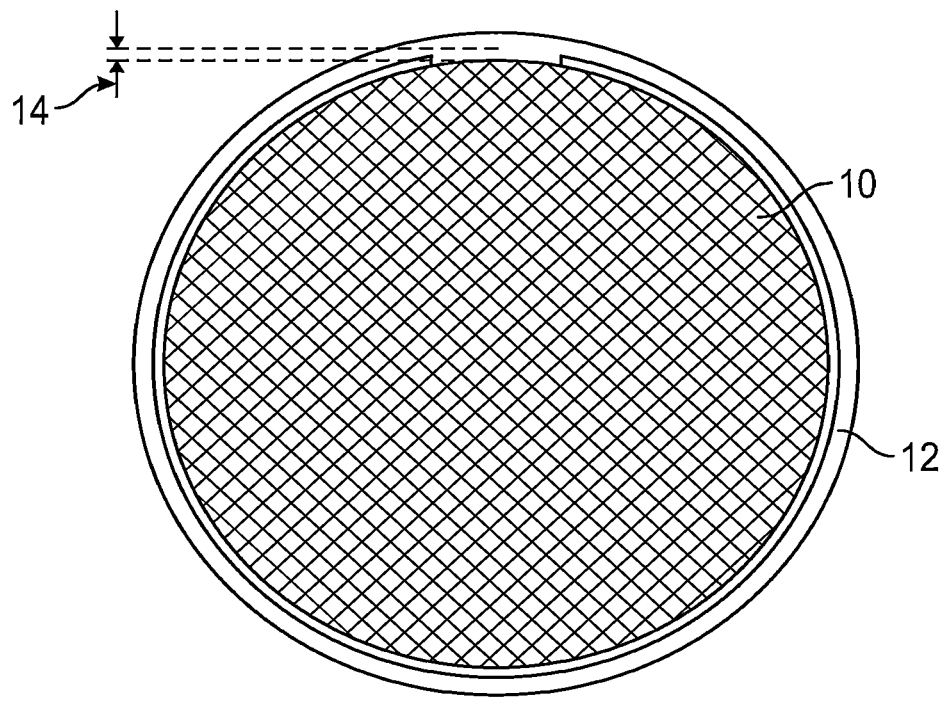
12
FIG. 1

300

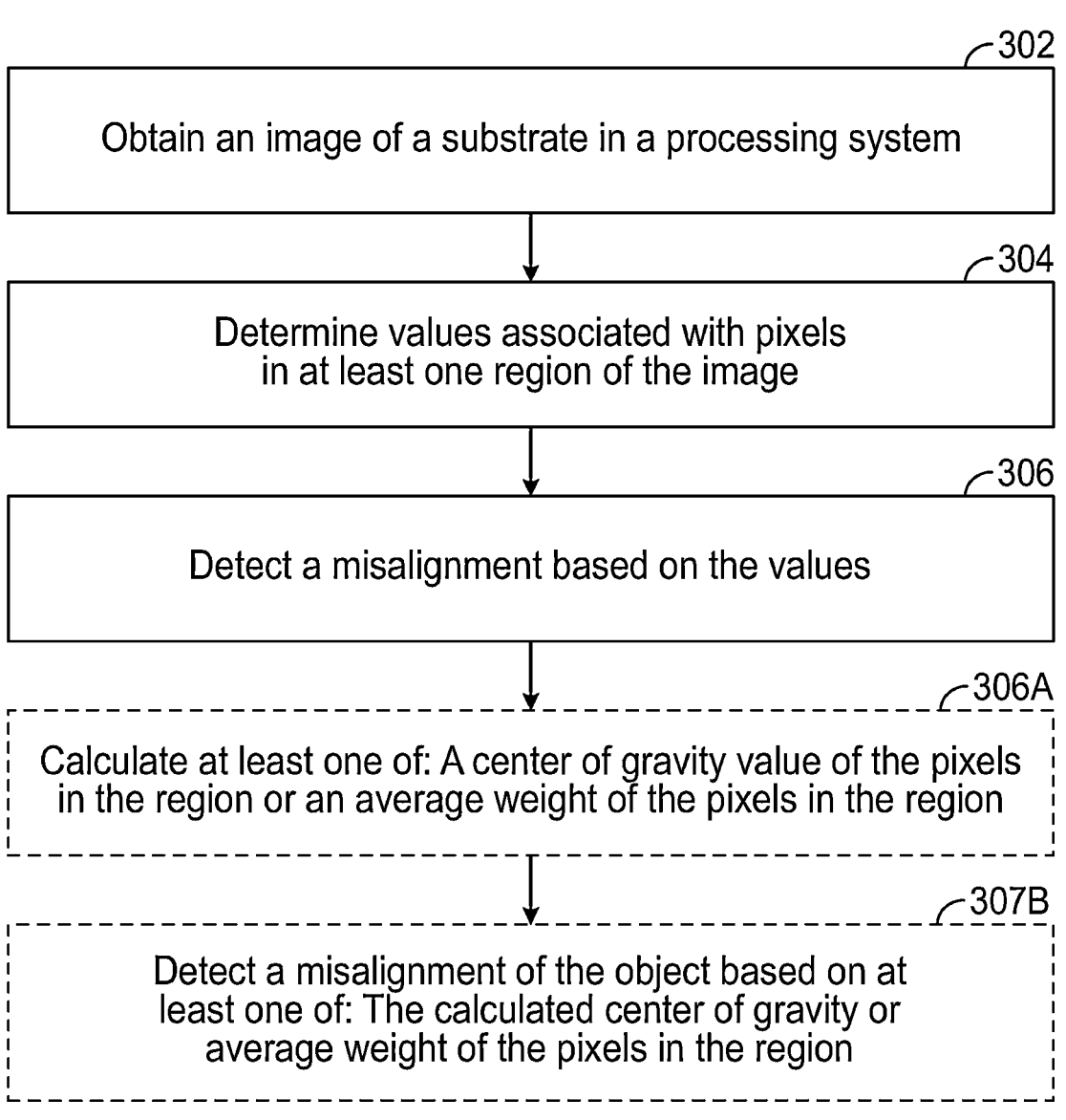

302

Obtain an image of a substrate in a processing system

304

Determine values associated with pixels
in at least one region of the image

306

Detect a misalignment based on the values

306A

Calculate at least one of: A center of gravity value of the pixels
in the region or an average weight of the pixels in the region

307B

Detect a misalignment of the object based on at
least one of: The calculated center of gravity or
average weight of the pixels in the region

Figure 5:
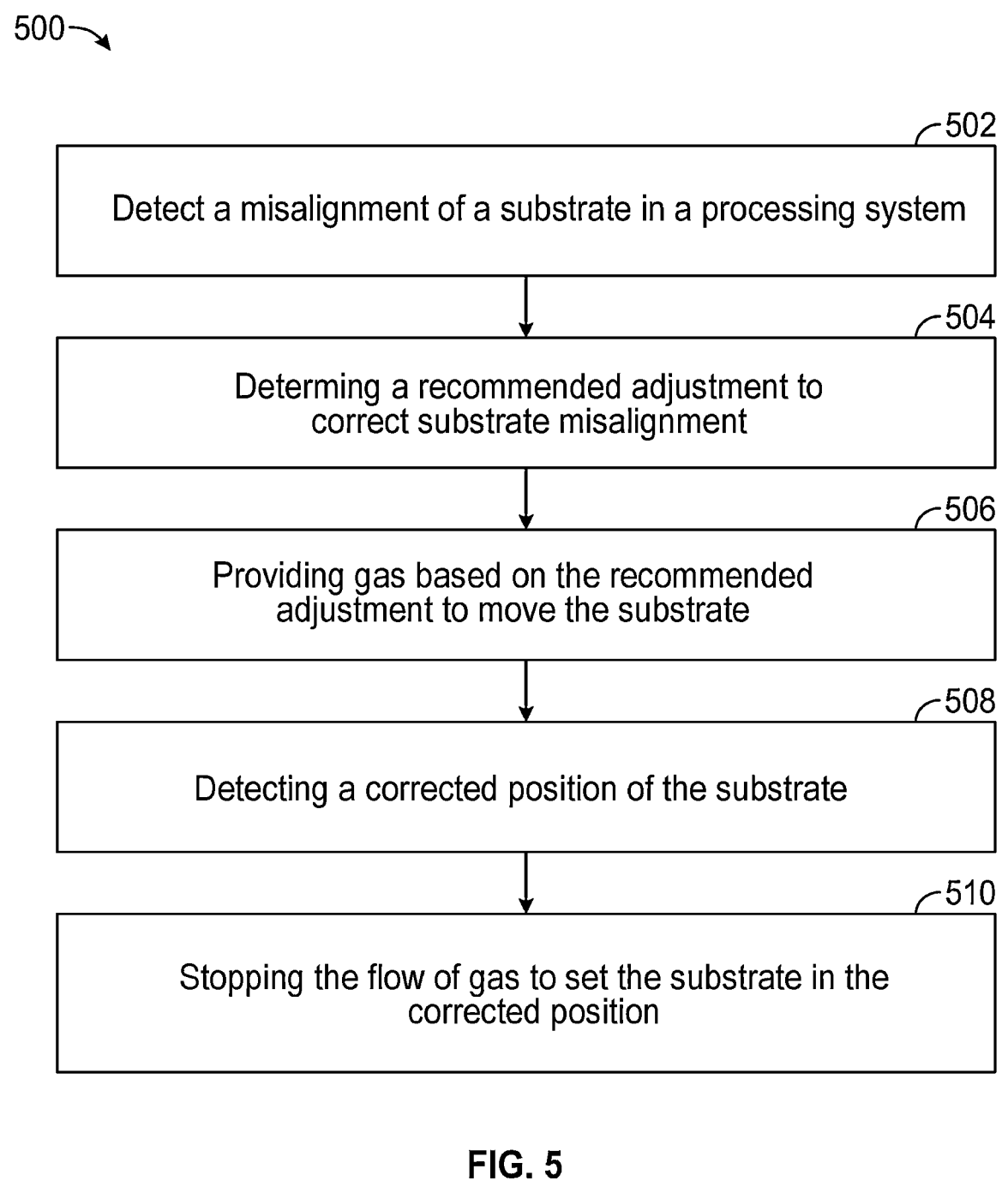

Detect a misalignment of a substrate in a processing system

504

Determing a recommended adjustment to correct substrate misalignment

506

Providing gas based on the recommended adjustment to move the substrate

508

Detecting a corrected position of the substrate

510

Stopping the flow of gas to set the substrate in the corrected position

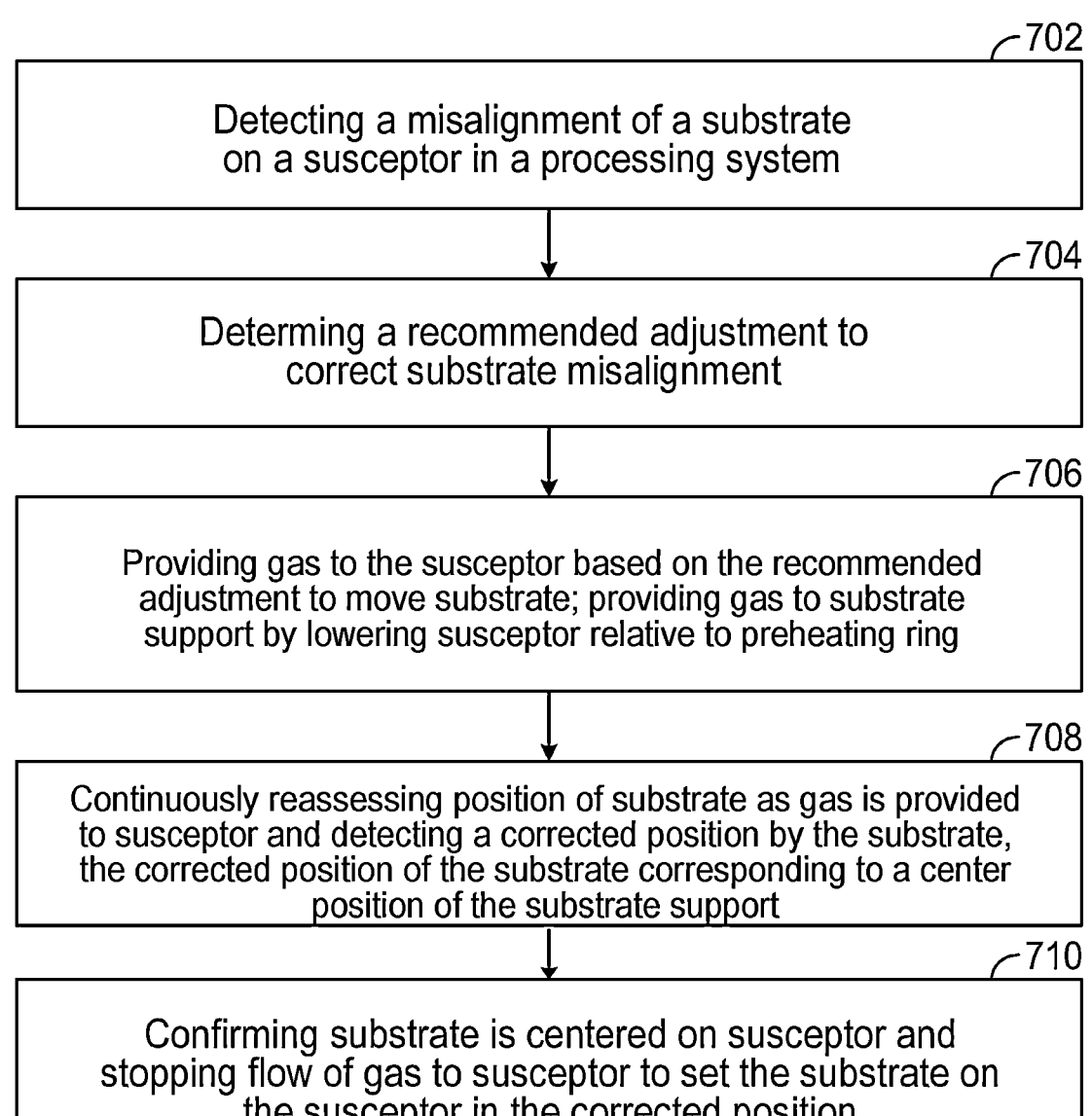

702

Detecting a misalignment of a substrate
on a susceptor in a processing system

704

Determing a recommended adjustment to
correct substrate misalignment

706

Providing gas to the susceptor based on the recommended
adjustment to move substrate; providing gas to substrate
support by lowering susceptor relative to preheating ring

708

Continuously reassessing position of substrate as gas is provided
to susceptor and detecting a corrected position by the substrate,
the corrected position of the substrate corresponding to a center
position of the substrate support

710

Confirming substrate is centered on susceptor and
stopping flow of gas to susceptor to set the substrate on
the susceptor in the corrected position

FIG. 7

SYSTEM AND METHOD FOR AUTO CORRECTION OF SUBSTRATE MISALIGNMENT

CROSS-REFERENCE TO RELATED APPLICATIONS

This application claims benefit of U.S. provisional patent application Ser. No. 63/392,796, filed Jul. 27, 2022, which is incorporated herein by reference in its entirety.

BACKGROUND

Field

Embodiments of the present disclosure generally relate to semiconductor manufacturing and processing. More particularly, the disclosure relates to systems and method for auto correcting misalignments of substrates in process chambers.

Description of the Related Art

In a semiconductor device fabrication process, such as CVD, epitaxy, or other thermal processing, substrates are often processed within chambers or other processing apparatuses. In order to process a substrate within the chamber, the substrate may be firmly attached to a substrate support within the chamber during processing to mitigate movement of the substrate. If the substrate moves during processing, the substrate may be come misaligned. Factors that may cause the substrate to become misaligned include the flow of gas, pressure, and temperature around the substrate support during processing. If the substrate becomes misaligned, uniformity in thickness and/or film properties may be adversely impacted.

Some semiconductor device fabrication processing systems may transfer a substrate between multiple chambers each having substrate support structures, for example, a deposition apparatus, an etching apparatus, an inspection apparatus, and the like. The substrate can be transferred between chambers by a transfer arm having a fork or an end effector. Such substrate exchange handling can result in shifts in the positioning of the substrate relative to the substrate support and become misaligned. When the substrate support structures within a processing system are improperly aligned, the support structures do not hold the substrates at about the same inclination, or tilt. Thus, when one support structure transfers a substrate to another support structure, such as when the lift pins remove a substrate from a blade of the transfer chamber substrate handler or place a substrate onto the substrate support in a process chamber, one point of the substrate would likely touch the receiving support structure before other points do. If substantial motion occurs prior to the remaining points making contact, then the substrate may move. In this manner, potentially contaminating particles may be scraped from the contacting points of the substrate causing backside contamination of the substrate. These particles may eventually work their way around to the top of the substrate and be deposited on the processed surface of the substrate, thereby contaminating the micro circuits or other structures constructed thereon. Additionally, when the substrate does not touch a receiving support structure with all points in very close alignment, the substrate may be shifted from its proper, or expected position thereby causing the substrate to be off-center. Moreover, temperature differences between the substrate and substrate support may induce thermal shock such that the substrate may warp. The warping of the substrate may also cause the substrate to shift and become misaligned. As mentioned above, an off-center substrate may undergo uneven or otherwise improper processing or may come in contact with surfaces or objects within the processing system that will contaminate the substrate, create potentially contaminating airborne particles or even break the substrate.

The need for placement accuracy is illustrated in FIG. 1. A typical substrate 10 and a substrate support, e.g., a susceptor 12 for holding the substrate 10 within a single-substrate process chamber, are depicted therein. For a given substrate 10, the pocket which receives the substrate 10 on a substrate receiving surface of a susceptor 12 generally has a diameter only slightly larger than that of the substrate 10. There is often a small clearance 14 between the edge of the substrate 10 and the edge of the pocket of the susceptor 12. The substrate 10 is centered in the pocket and a gap is maintained between the edge of the substrate 10 and the sidewalls of the pocket. If the substrate 10 has contact with the sidewalls of the pocket, local temperature changes occur, resulting in temperature gradients across the substrate 10. This can cause non-uniformity in process results, as most semiconductor processing depends critically on temperature. Similarly, misaligned or un-centered substrates can be damaged during placement in a number of different handling situations.

Substrate misalignment may occur either before or during processing of the substrate in the process chamber. As discussed above, substrate misalignment can cause non-uniformity in process results. As such, when substrate misalignment is detected, such misalignment should be corrected promptly to avoid uneven or otherwise improper processing of the substrate.

Therefore, a need exists for a system and method for monitoring and auto correcting the position of substrates when misalignment of the substrate is detected.

SUMMARY

Embodiment of the present disclosure generally relate to semiconductor manufacturing and processing. More particularly, embodiments disclosed herein relate to processing systems and method for auto correcting misalignments of substrates in process chambers.

In some embodiments, a processing system for auto centering substrates in a process chamber is provided. The processing system includes a process chamber having a substrate support disposed within a chamber volume of the process chamber. The substrate support includes a pocket for receiving a substrate, and a plurality of flow conduits extending between a top surface of the pocket and a bottom surface of the substrate support. An imaging device is coupled to the process chamber and configured to monitor a position of a substrate when loaded in the pocket of the substrate support.

In some embodiments, a processing system for auto centering substrates in a process chamber is provided. The processing system includes a process chamber having a susceptor and a preheat ring disposed within a chamber volume of the process chamber. The susceptor includes a pocket for receiving a substrate and the preheat ring radially overlaps the susceptor. A plurality of conduits extend through portions of the susceptor and an imaging device is coupled to the process chamber and configured to monitor a substrate in the pocket of the susceptor.

In some embodiments, a method of auto centering substrates in a process chamber is provided. The method includes detecting a misalignment of a substrate loaded on a substrate support disposed in a chamber volume of a process chamber. The method includes determining a recommended adjustment based on the misalignment to correct the misalignment and providing gas flow from the chamber volume to the substrate support based on the recommended adjustment. The method includes detecting a corrected position of the substrate on the substrate support, wherein the corrected position corresponds to a center position of the substrate support. And the method includes stopping the flow of gas to the substrate support to set the substrate on the substrate support in the corrected position.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 1 is a schematic diagram showing a 200 mm substrate in place in a pocket of a substrate holder of a susceptor, in both top and cross sectional views, in accordance with certain embodiments of the present disclosure.

FIG. 3 is a flow diagram illustrating an example method for detecting misalignment of substrates in the processing system of FIG. 2A, in accordance with certain embodiments of the present invention.

FIG. 5 is a flow diagram illustrating an example method for auto correcting misalignment of substrates on the susceptor of FIG. 2, in accordance with certain embodiments of the present disclosure.

FIG. 7 is a flow diagram illustrating an example method for auto correcting misalignment of substrates on the susceptor of FIG. 6, in accordance with certain embodiments of the present disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates semiconductor manufacturing and processing. More particularly, the disclosure relates to a system and method for auto correcting substrate misalignment on a substrate support (e.g., susceptor).

Processing systems for processing substrates are generally known. Typically, such processing systems have a centralized transfer chamber mounted on a monolith platform. The transfer chamber is the center of activity for the movement of substrates being processed in the system. One or more process chambers mount on the transfer chamber at slit valves through which substrates are passed by a substrate handler, or robot. Access to the transfer chamber from the clean ambient environment is typically through one or more load lock chambers attached at other slit valves. The load lock chambers may open to a very clean room, referred to as the white area, or to an optional substrate handling chamber, typically referred to as a mini-environment.

Figure 2:
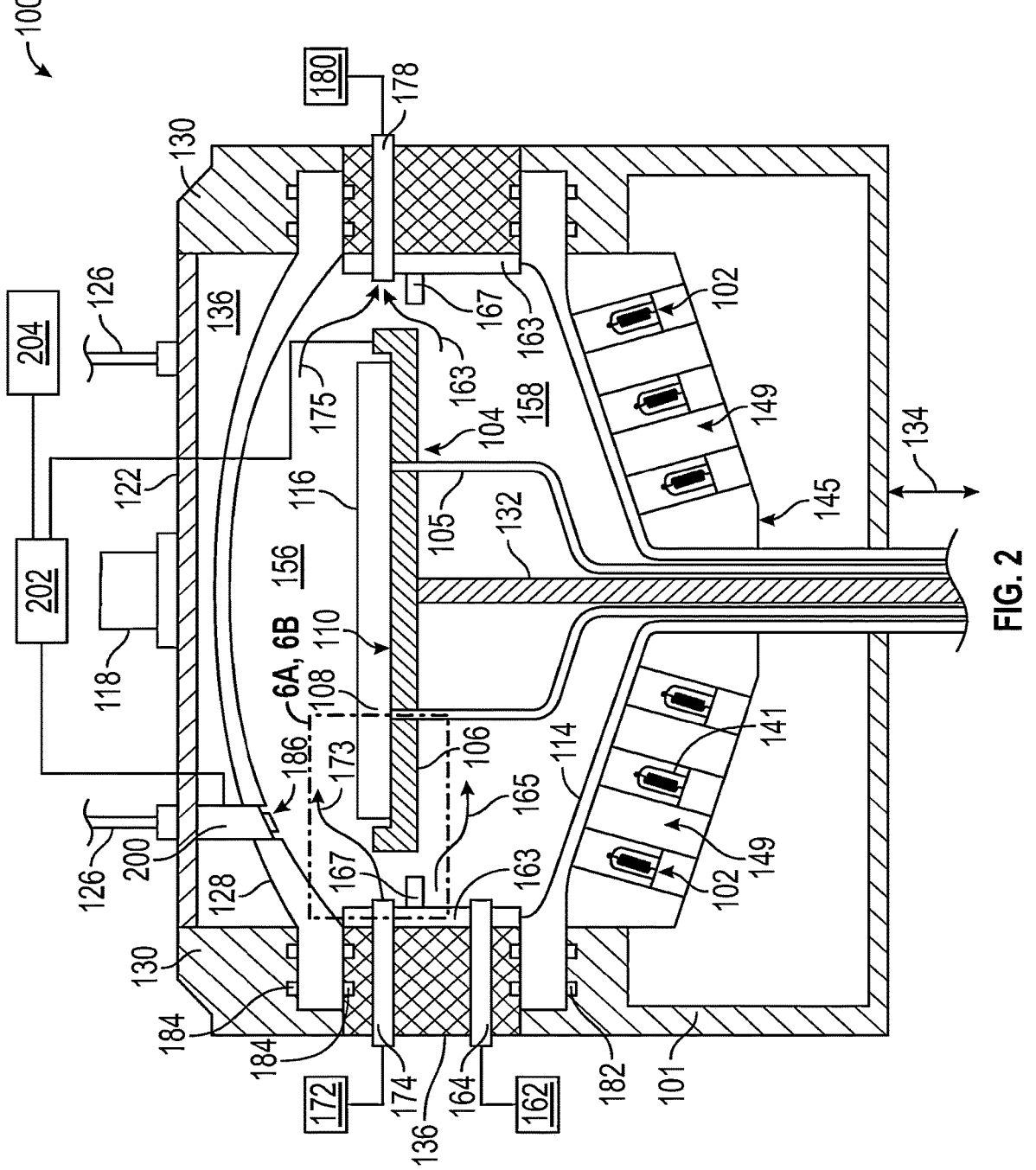
FIG. 2 schematically illustrates an example processing system that can be used to perform the process methods describe herein, in accordance with certain embodiments of the present disclosure.

FIG. 2 is a schematic cross-sectional view of a processing system 100 that may be used to perform the process methods described herein. Here, the processing system 100 is configured to auto correct the positioning of a substrate 108 on a substrate support, such as a susceptor 106 in a process chamber 101, when a misalignment of the substrate 108 on the susceptor 106 is detected. The process chamber 101 may be used to process one or more substrates, including the deposition of a material on an upper surface of the substrate 108 (e.g., which may be similar to substrate 10).

The process chamber 101 may include an array of radiant heating lamps 102 for heating, among other components, a back side 104 of a susceptor 106 (e.g., which may be a susceptor 12 shown in FIG. 1) disposed within a chamber volume 123 of the process chamber 101. In some embodiments, the array of radiant heating lamps may be disposed over the upper dome 128. The susceptor 106 may be a disk-like susceptor 106 as shown, or may be a ring-like susceptor with no central opening, which supports the substrate from the edge of the substrate to facilitate exposure of the substrate to the thermal radiation of the lamps 102.

The susceptor 106 is located within the process chamber 101 between an upper dome 128 and a lower dome 114. The upper dome 128, the lower dome 114 and a base ring 136 that is disposed between the upper dome 128 and lower dome 114 generally define an internal region of the process chamber 101. The substrate 108 (not to scale) can be brought into the process chamber 101 and positioned onto the susceptor 106 through a loading port 103.

The susceptor 106 is shown in an elevated processing position, but may be vertically traversed by an actuator (not shown) to a loading position below the processing position to allow lift pins 105 to contact the lower dome 114, passing through holes in the susceptor 106 and the central shaft 132, and raise the substrate 108 from the susceptor 106. A robot (not shown) may then enter the process chamber 101 to engage and remove the substrate 108 therefrom though the loading port 103. The susceptor 106 then may be actuated up to the processing position to place the substrate 108, with its device side 116 facing up, on a front side 110 of the susceptor 106.

The susceptor 106, while located in the processing position, divides an internal chamber volume 123 of the process chamber 101 into a process gas region 156 that is above the substrate, and a purge gas region 158 below the susceptor 106. The susceptor 106 is rotated during processing by a central shaft 132 to minimize the effect of thermal and process gas flow spatial anomalies within the process chamber 101 and thus facilitate uniform processing of the substrate 108. The susceptor 106 is supported by the central shaft 132, which moves the substrate 108 in an up and down direction 134 during loading and unloading, and in some instances, processing of the substrate 108. The susceptor 106 may be formed from silicon carbide or graphite coated with silicon carbide to absorb radiant energy from the lamps 102 and conduct the radiant energy to the substrate 108.

In general, the central window portion of the upper dome 128 and the bottom of the lower dome 114 are formed from an optically transparent material such as quartz. "Optically transparent" here means generally transmissive to radiation, but not necessarily 100% transmissive. As will be discussed in more detail below with respect to FIG. 2A, the thickness and the degree of curvature of the upper dome 128 may be configured in accordance with the present invention to provide a flatter geometry for uniform flow uniformity in the process chamber.

One or more lamps, such as an array of lamps 102, can be disposed adjacent to and beneath the lower dome 114 in a specified, optimal desired manner around the central shaft 132 to independently control the temperature at various regions of the substrate 108 as the process gas passes over, thereby facilitating the deposition of a material onto the upper surface of the substrate 108. While not discussed here in detail, the deposited material may include gallium arsenide, gallium nitride, or aluminum gallium nitride.

The lamps 102 may be configured to include bulbs 141 and be configured to heat the substrate 108 to a temperature within a range of about 200 degrees Celsius to about 1600 degrees Celsius. Each lamp 102 is coupled to a power distribution board (not shown) through which power is supplied to each lamp 102. The lamps 102 are positioned within a lamphead 145 which may be cooled during or after processing by, for example, a cooling fluid introduced into channels 149 located between the lamps 102. The lamphead 145 conductively and radiatively cools the lower dome 114 due in part to the close proximity of the lamphead 145 to the lower dome 114. The lamphead 145 may also cool the lamp walls and walls of the reflectors (not shown) around the lamps. Alternatively, the lower dome 114 may be cooled by a convective approach. Depending upon the application, the lampheads 145 may or may not be in contact with the lower dome 114.

A circular shield 167 may be optionally disposed around the susceptor 106 and surrounded by a liner assembly 163. The shield 167 prevents or minimizes leakage of heat/light noise from the lamps 102 to the device side 116 of the substrate 108 while providing a pre-heat zone for the process gases. The shield 167 may be made from CVD SiC, sintered graphite coated with SiC, grown SiC, opaque quartz, coated quartz, or any similar, suitable material that is resistant to chemical breakdown by process and purging gases.

The liner assembly 163 is sized to be nested within or surrounded by an inner circumference of the base ring 136. The liner assembly 163 shields the chamber volume 123 (i.e., the process gas region 156 and purge gas region 158) from metallic walls of the process chamber 101. The metallic walls may react with precursors and cause contamination in the chamber volume 123. While the liner assembly 163 is shown as a single body, the liner assembly 163 may include one or more liners with different configurations.

As a result of backside heating of the substrate 108 from the susceptor 106, the use of an optical pyrometer 118 for temperature measurements/control on the susceptor can be performed. This temperature measurement by the optical pyrometer 118 may also be done on substrate device side 116 having an unknown emissivity since heating the substrate front side 110 in this manner is emissivity independent. As a result, the optical pyrometer 118 can only sense radiation from the hot substrate 108 that conducts from the susceptor 106, with minimal background radiation from the lamps 102 directly reaching the optical pyrometer 118.

A reflector 122 may be optionally placed outside the upper dome 128 to reflect infrared light that is radiating off the substrate 108 back onto the substrate 108. The reflector 122 may be secured to the upper dome 128 using a clamp ring 130. The reflector 122 can be made of a metal such as aluminum or stainless steel. The efficiency of the reflection can be improved by coating a reflector area with a highly reflective coating such as with gold. The reflector 122 can have one or more conduits 126 connected to a cooling source (not shown). The conduit 126 connects to a passage (not shown) formed on a side of the reflector 122. The passage is configured to carry a flow of a fluid such as water and may run horizontally along the side of the reflector 122 in any desired pattern covering a portion or entire surface of the reflector 122 for cooling the reflector 122.

Process gas supplied from a process gas supply source 172 is introduced into the process gas region 156 through a process gas inlet 174 formed in the sidewall of the base ring 136. The process gas inlet 174 is configured to direct the process gas in a generally radially inward direction. During the film formation process, the susceptor 106 may be located in the processing position, which is adjacent to and at about the same elevation as the process gas inlet 174, allowing the process gas to flow up and round along flow path 173 across the upper surface of the substrate 108 in a laminar flow fashion. The process gas exits the process gas region 156 (along flow path 175) through a gas outlet 178 located on the side of the process chamber 101 opposite the process gas inlet 174. Removal of the process gas through the gas outlet 178 may be facilitated by a vacuum pump 180 coupled thereto. As the process gas inlet 174 and the gas outlet 178 are aligned to each other and disposed approximately at the same elevation, it is believed that such a parallel arrangement, when combing with a flatter upper dome 128 (as will be discussed in detail below), will enable a generally planar, uniform gas flow across the substrate 108. Further radial uniformity may be provided by the rotation of the substrate 108 through the susceptor 106.

Purge gas supplied from a purge gas supply source 162 is introduced into the purge gas region 150 through a purge gas inlet 164 formed in the sidewall of the base ring 136. The purge gas inlet 164 may be disposed at an elevation below the susceptor 106 thereby allowing the purge gas to flow down and round along flow path 165 across the bottom surface of the susceptor 106. The purge gas may be an inert gas, such as hydrogen or nitrogen. The flow of purge gas in the purge gas region 158 helps prevent or reduce the flow of process gas or diffusion of process gas from the process region 156 above the susceptor 106 to the purge gas region 158 below the susceptor 106. The purge gas exits the purge gas region 158 through the gas outlet 179. Alternatively, the purge gas region 158 may further include a vent (not shown) for exhausting purge gas directly from the purge gas region 158 into the gas outlet 178. Exhaust of the purge gas through the gas outlet 179 is also facilitated by the vacuum pump 180.

As mentioned above, the substrate 108 may become misaligned (e.g., due to degradation or other factors) on the substrate receiving surface of the susceptor 106 and/or the susceptor 106 may become misaligned and may not rotate evenly, be tilted, or off-center. Such misalignments may result in the substrate 108 being processed non-uniformly. In order to detect such misalignments for auto correcting by the processing system 100, a position detection apparatus, e.g., camera 200 may be employed in the processing system 100 and connected to the process chamber 101.

As shown in FIG. 2, the process chamber 101 may include a camera 200 for monitoring the position of the substrate 108 and detecting misalignment and subsequent correction of the substrate 108 on the susceptor 106. The camera 200 can be communicatively coupled to a controller 202 that controls operations (e.g., on/off, focusing, image-taking, and the like) of the camera 200. In some embodiments, the controller 202 is communicatively coupled to a central processing unit (CPU) 204. The controller 202 may download a program stored in a storage medium through an input/output (I/O) device (not shown), and carry out a position detection method described below by controlling the camera 200 in accordance with the program.

In one embodiment, as shown in FIG. 1, the camera 200 may be positioned above the top of the process chamber 101, and a collection device, for example a light pipe, for the camera may be disposed through the top of the process chamber 101 into the process gas region 156. Alternately, the camera 200 may be positioned inside the process chamber 101. For example, the camera 200 may be disposed in an opening 186 in the upper dome 128 between the upper dome 128 and the reflector 122. The camera 200, or a collection device for the camera, may be disposed through a portal for connecting the conduit 126 to the process chamber 101, or alternatively, the camera 200 may be coupled to the chamber using a chassis. The camera 200 may be capable of operating in a vacuum or at atmospheric pressure. The camera 200 may be in the process chamber 101 to take an image of the substrate 108, an edge ring, a mask, and/or the susceptor 106. The position of the camera 200 relative to the upper dome 128 and the susceptor 106, and the optical characteristics of the camera 200 may be determined to ensure a field of view that includes an edge of the substrate 108, edge ring, mask, and/or or susceptor 106 for use in the position detection.

The camera 200 is only one example of an apparatus that can be used for imaging and that any other types of imaging apparatus can be used as a positioning detection apparatus. In embodiments, more than one camera can be used to capture images of the substrate 108, edge ring, mask, and/or or susceptor 106. In embodiments, the camera 200 is an image capturing device may be a high efficiency, low voltage complementary metal oxide semiconductor (CMOS) sensor, which functions as a single chip video camera. The CMOS sensor may be of the VGA type. The camera 200 may include a lens, such as a wide angle lens or a plano-convex type lens having an appropriate focal length to provide sufficient visual clarity within the desired range of operation of the camera 200. It will be apparent to those skilled in the art that different lenses (e.g., telescoping or rotational prism lenses) may be used for different applications. It will also be appreciated that other types of cameras or optical sensors may be employed, including, but not limited to cameras of the SVGA, XGA, MEGA pixel type, or other image capturing devices. If desired, multiple image capturing devices of differing types of resolution can be employed in conjunction with lenses of varying types and focal lengths. The camera or sensor could be of a static (still) or dynamic (video) type, and could be of the charged coupled device (CCD) type. In addition, the camera could be used to output a video signal to any standard TV format.

FIG. 3 is a flow diagram illustrating example operations 300 for detecting misalignment of an object in a processing system, in accordance with certain embodiments of the present disclosure. At 302 an image of the object may be obtained. The object may be a substrate, a mask, an edge, susceptor, or the like. The image may be obtained using a high resolution video camera (e.g., CMOS, SVGA, XGTA, or MEGA pixel type). According to certain embodiments, the image may be obtained while the object is rotating.

At 304, values associated with pixels (e.g., RGB values) in at least one region of the image may be determined. The values may be from either the raw image or a filtered image.

At 306, a misalignment of the object may be detected based on the values. According to certain embodiments, the detection of the misalignment of the object may include blocks 306A and 306B. For example, at 306A, at least one of: a center of gravity value of the pixels in the region or an average weight of the pixels in the region may be calculated and, at 0.03B, a misalignment of the object may be detected based on at least one of: the calculated center of gravity or average weight of the pixels in the region.

According to certain embodiments, the operations 300 may further include obtaining a second image of the object subsequent to obtaining the first image (e.g., at a later time). Values associated with pixels in the at least one region of the second image may be determined and compared to the determined values associated with the pixels in the at least one region of the first image. Detection of the misalignment of the object may be further based on the comparison (e.g., by observing how the center of gravity value and/or the average weight of the pixels in the at least one region change from the first image to the second image).

According to certain embodiments, detected misalignment values may be outputted in order to allow the misalignment to be corrected. In an embodiment, the detected misalignment can be outputted to the feedback system for use in determining recommended adjustment to the substrate to correct the misalignment. The feedback system may then initiate a process to move the position of the substrate on the susceptor and correct the misalignment based on the determined recommended adjustment. In some embodiments, the recommended determined adjustments may shift the position of the substrate in the pocket of the susceptor between about 0.1 mm and about 0.5 mm. Additionally or alternatively, the misalignment values may be stored in a memory connected to the optical imaging apparatus. If output on a screen, monitor, printout, or the like, the value of center of gravity and weight may be output as a signal and monitored for oscillations which may indicate misalignment.

Additional information regarding system and methods for detecting substrate misalignment can be found, e.g., in U.S. Pat. No. 9,959,610.

Once misalignment of the substrate 108 on the susceptor 106 is detected, the misalignment of the substrate 108 can be corrected, thereby preventing errors in the substrate manufacturing or processing.

Figure 4:
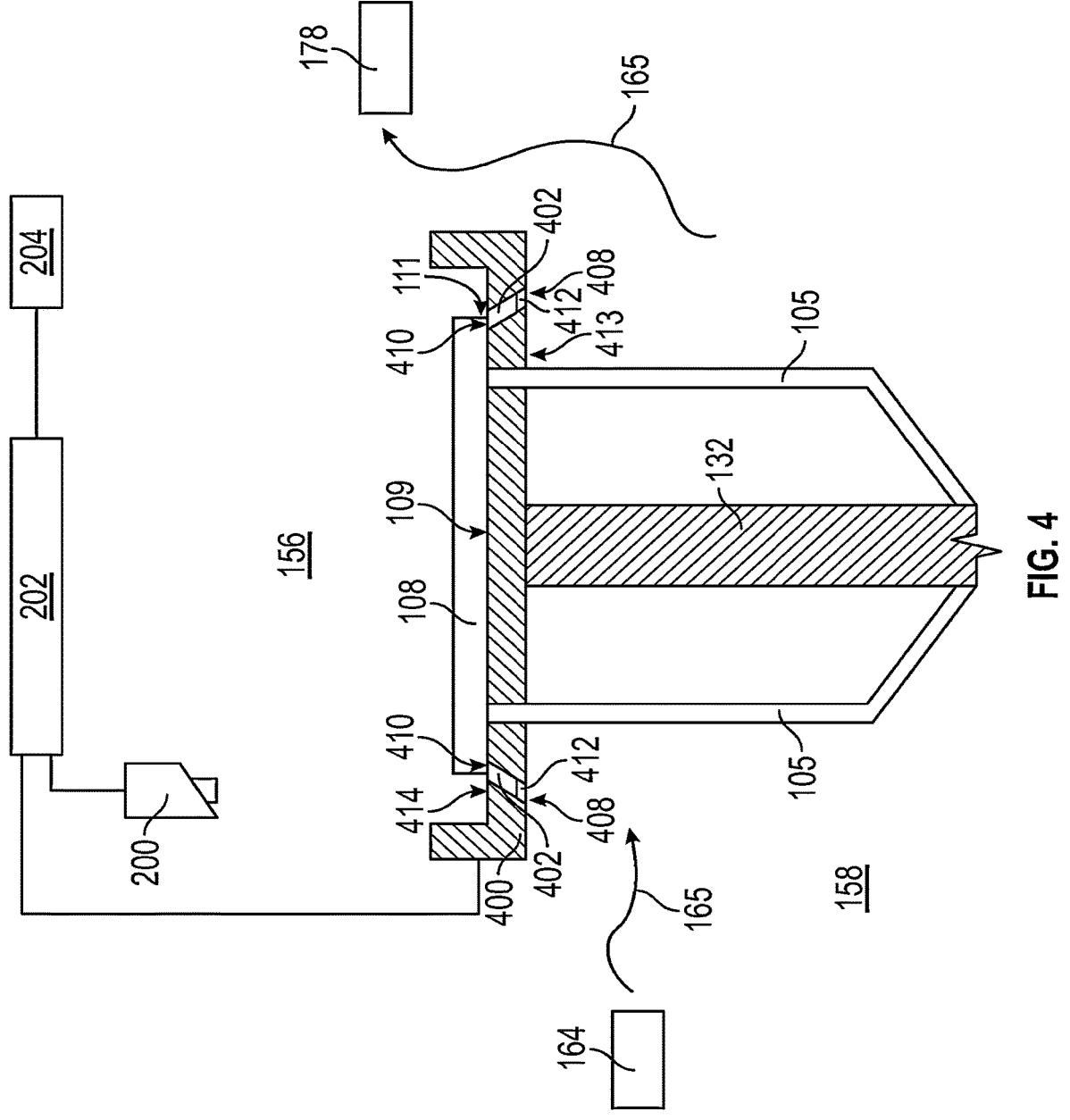
FIG. 4 is a cross-sectional view of an example susceptor that may be used in the processing system of FIG. 2A, in accordance with certain embodiments of the present disclosure.

FIG. 4 is a cross sectional view of an example susceptor 400 that may be used in the process chamber 101 of FIG. 1, in accordance with certain embodiments of the present disclosure. As described above, the substrate 108 can be brought into the chamber volume 123 of the process chamber 101 and positioned within a pocket 404 on a substrate receiving surface 403 of the susceptor 400, for processing of the substrate 108.

In an embodiment, as shown in FIG. 4, the susceptor 400 includes a plurality of flow conduits 402 disposed therein in fluid connection with a purge gas region 158 below the susceptor 106. The plurality of flow conduits 402 described herein is capable of directing gas flow from the purge gas region 158 towards portions of the pocket 404 of the susceptor 400 and any substrate 108 positioned in the pocket therein. The flow of gas through the flow conduits 402 at any substrate 108 positioned in the pocket 404 therein may be configured such that pressure from the gas is sufficient to lift the substrate 108 and move the substrate 108. The plurality of flow conduits 402 can be communicatively coupled to and controlled by a feedback system described herein.

The feedback system may be connected between the plurality of flow conduits 402 in the susceptor 400, the controller 202, and the camera 200 such that the plurality of flow conduits 402 operate by responding to misalignment and correction of the substrate position detected by the camera 200. As discussed above, the camera 200 may be used by the feedback system to actively monitor the position of the substrate 108 within the pocket 404 to detect misalignments of the substrate 108 on the susceptor 106, as well as determine when misalignments are corrected after procedures to move the substrate are initiated. When misalignment of the substrate 108 on the susceptor 106 is detected, the feedback system can then initiate auto correct procedures to move the substrate 108 and correct the misalignment by providing gas flow through the plurality of conduits 402. The feedback system may use the controller 202 to also control each of the flow valves 412 to start and stop gas flow through the plurality of flow conduits 402 to control the flow of gas into the pocket 404.

In certain embodiments, each of the plurality of flow conduits 402 include an inlet opening 408 at a bottom surface 413 of the susceptor 400 in fluid connection with an outlet opening 410 at a top surface 414 of the pocket 404 of the susceptor 400. In one embodiment, the outlet openings 410 may be positioned near the outer edges of the pocket 404 such that gas flow through the flow conduits 402 may be directed towards a bottom edge 111 and a bottom surface 109 of the substrate 108 in the pocket 404. The outlet openings 410 may also be formed along the interior side wall of the pocket 404 such that gas flow from the respective outlet openings 410 may be directed at the side of the substrate 108. Alternatively, the outlet openings 410 may be disposed on any other portions of the pocket 404 to enable gas flow to be directed to any portion of substrate 108 from the surface 414. In another embodiment, the size of the outlet opening 410 in each of the plurality of flow conduits 402 may generally be the same. Alternatively, the size of the outlet openings 410 may also be varied to provide greater gas flow to certain portions of the pocket 404.

In another embodiment, each of the plurality of flow conduits 402 may further includes a controllable flow valve 412 for controlling the respective flow rates of gas through each of the plurality of flow conduits 402. In an embodiment, each of the flow valve 412 of the plurality of flow conduits 402 may be communicatively coupled to the controller 202 and the camera 200 in the feedback system. The feedback system may also be connected to the CPU 204 for misalignment detection and correction detection by the camera 200. The CPU 204 may also be communicatively coupled to the susceptor 400 and is capable of determining a recommended adjustment when a misalignment is detected. The CPU 204 may provide instructions to the controller 202 for controlling the flow valves 412 for the plurality of flow conduits 402 to start and stop gas flow through the flow conduits 402 based on the recommended adjustment.

The plurality of flow valves 412 in the susceptor 400 is communicatively coupled to the controller 202 which can dynamically control operations (e.g., opening and closing) of the flow valves 412 in the feedback system. When moving of the substrate 108 is desired (e.g. to correct a detected misalignment), the flow valves 412 are opened to enable gas from the purge gas region 158 below the susceptor 106 to enter and flow through the flow conduits 402 to the pocket 404 on the substrate receive surface 403 of the susceptor 400. When the flow valves 412 are open, gas flowing through the plurality of flow conduits 402 described herein may be capable of lifting the substrate 108 off the surface 403 of the pocket 404 and move the substrate 108 along the horizontal X-Y plane of the pocket 404 using the pressure of the gas flowing from the flow conduits 402. In one embodiment, the flow valves 412 may be controlled to selectively flow gas through certain flow conduits 402 based on the direction of the desired movement of the substrate 108. When auto correcting procedures are initiated by the feedback system to move and correct a misalignment of the substrate 108, the plurality of flow valves 412 to be opened by the feedback system may be activated together, separately, and/or sequentially in response to the movement of the substrate 108 to correct the detected misalignment and center the substrate 108 in the pocket 404. In another embodiment, the flow valves 412 may be configured to be a fixed flow valve capable of being controlled by the feedback system to dynamically adjust and set the pressure of the gas flowing through the flow conduits 402 to control the amount of force applied against the substrate 108.

In certain embodiments, control of the flow valves 412 is connective coupled to the feedback system to move the substrate 108 when misalignments of the substrate 108 is detected. The feedback system may be connected between the camera 200 monitoring the position of the substrate 108 and the plurality of flow valves 412 such that the flow valves 412 operate selectively in response to the misalignment of the substrate 108 detected by the camera 200 to correct the detected misalignment. As discussed herein, the camera 200 is used by the feedback system to detect misalignments of the substrate 108 in the pocket 404 of the susceptor 106. Based on the detected misalignment of the substrate 108 by the camera 200, the feedback system determines a recommended adjustment to properly center the substrate 108 in the pocket 404. The feedback system then selectively controls the flow valves 412 to provide flow of gas through certain flow conduits 402 to enable and direct gas at certain portions of the substrate 108 to move the substrate 108 along the horizontal X-Y plane of the pocket 404 based on the recommended adjustment.

For example, if the recommended adjustment includes the substrate 108 being moved to the right of its current location, the feedback system may open flow valves 412 of the plurality flow conduits 402 near the opposite left side of the substrate 108 to apply a gas flow against the left side of the substrate 108 and push the substrate 108 right.

FIG. 5 is a flow diagram illustrating example operations of a method 500 for auto correcting misalignment of the substrate 108 by the processing system 100 when the substrate 108 is disposed on the susceptor 400 of FIG. 4, in accordance with certain embodiments of the present disclosure. The method 500 begins at 502 with detecting a misalignment of substrate 108 from a center position of the pocket 404 of the susceptor 400 in the processing system 100.

At 504, upon detection of misalignment of the substrate 108, the processing system 100 determines a recommended adjustment to correct the detected misalignment and move the substrate 108 to the center position of the pocket 404. The recommended adjustment may be determined based on the first position of the substrate 108 from which the misalignment was detected by the camera 200.

At 506, the processing system 100 provides gas flow to the pocket 404 of the susceptor 400 based on the recommended adjustment to move the substrate 108 along a horizontal X-Y plane of the pocket 404. In an embodiment, gas is provided by being flowed through the plurality of flow conduits 402 of the susceptor 400 based on the recommended adjustment to lift and move the substrate 108 from the current misaligned position to the expected center position. In one embodiment, if the detection of the misalignment in step 502 and providing of gas in step 506 occurs during processing of the substrate 108, gas may already be flowing in the purge gas region 158 of the chamber volume 123 adjacent to the inlet openings 408 of the plurality of flow conduits 402 such that an opening of the flow valves 412 may be all that is required to flow gas through the plurality of flow conduits 402. Alternatively, if the detection of the misalignment in step 502 and providing of gas in step 506 occurs before processing commences, the providing of gas flow to the pocket 404 in step 506 may further include initiating gas flow from the purge gas supply source 162 into the purge gas region 158 of the chamber volume 123.

In step 508, as gas is provided through the plurality of flow conduits 402 based on the recommended adjustment, the position of the substrate 108 in the pocket 404 is continuously monitored by the camera 200 and reassessed to determine if the misalignment is corrected such that the substrate 108 is in the center position of the pocket 404. If the substrate remains misaligned from the center of the pocket 404 such that the current flow of gas provided in step 506 through the plurality of flow conduits 402 is no longer consistent with the recommended adjustment based on a second misaligned position of the substrate 108, steps 504 and 506 are repeated with a new recommended adjustment being determined based on the second misaligned position of the substrate 108 and gas flow being modified and provided in 506 based on the new recommended adjustment for the second misaligned position of the substrate 108.

If the misalignment of the substrate 108 is determined to have been corrected in step 508 such that the substrate 108 has been moved to a new position corresponding with the center position of the pocket 404, in step 510, the processing system 100 ceases the flow of gas through the flow conduits 402 to set the substrate 108 in the new position of the pocket 404 corresponding with the center position.

Figure 6A:
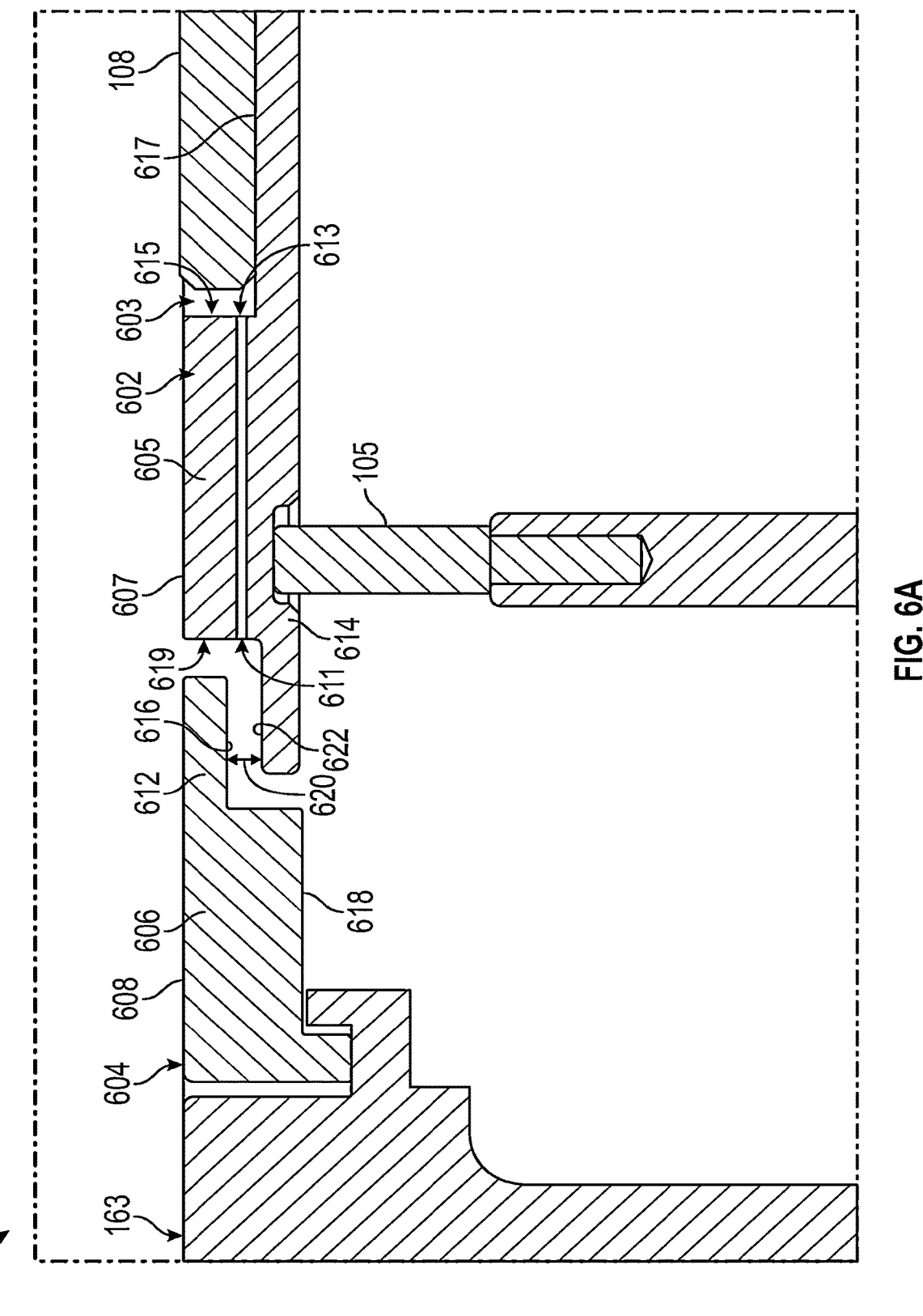
FIGS. 6A and 6B are cross-sectional views of an example susceptor that may be used in the processing system of FIG. 2, in accordance with certain embodiments of the present disclosure.
Figure 6B:
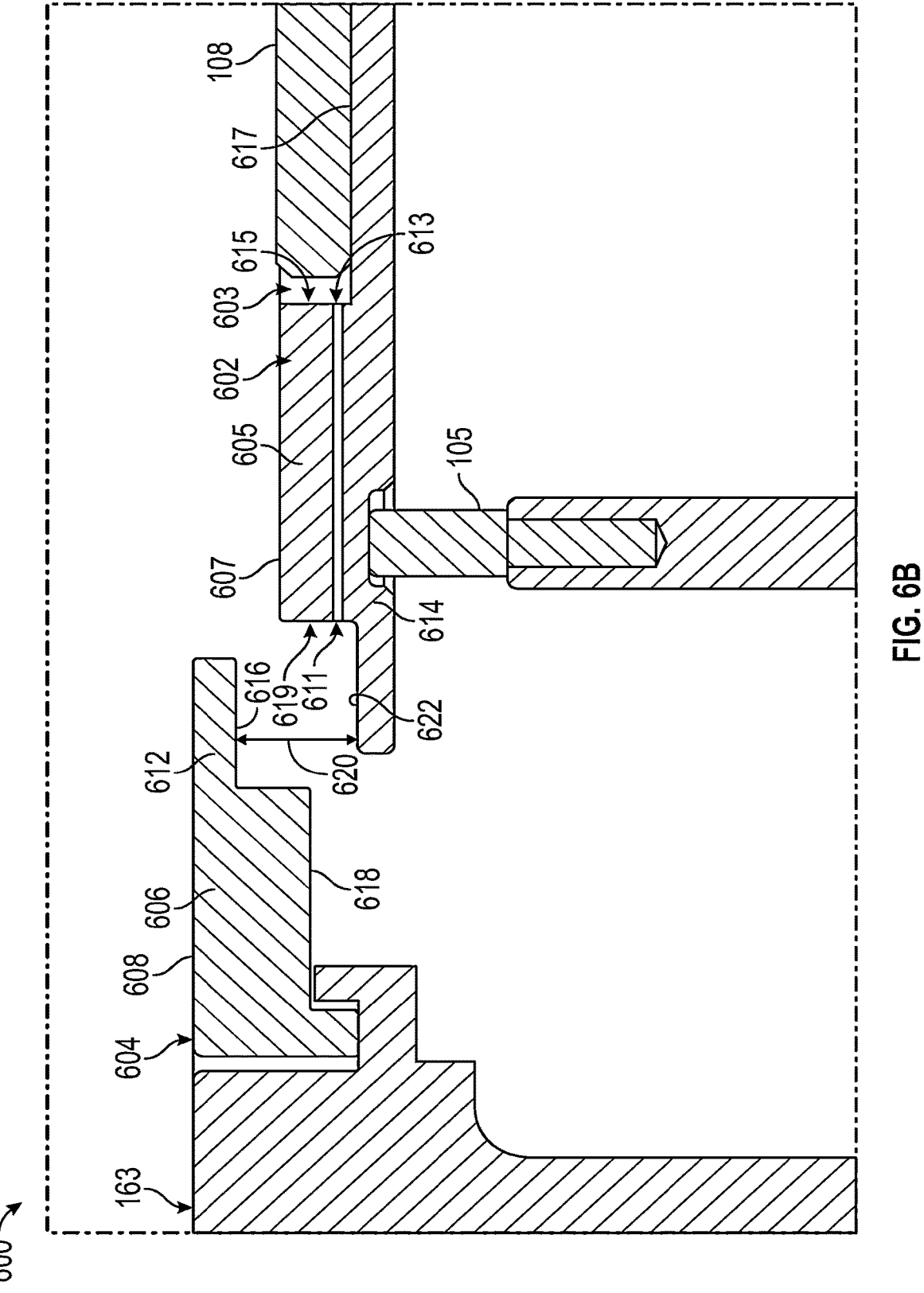

FIGS. 6A and 6B are schematic cross-sectional views of a portion of an example susceptor in a process chamber 600, in accordance with certain embodiments of the present disclosure.

Process chamber 600 includes a susceptor 602 having a pocket 603 for receiving the substrate 108 in the pocket 603 and a preheat ring 604. Heating of the susceptor 602 and the preheat ring 604 contributes to thermal decomposition of process gases onto the substrate 108 to form one or more layers on the substrate 108 disposed in the pocket 603 of the susceptor 602. The preheat ring 604 may be coupled to the liner assembly 163 of process chamber 600 for supporting and positioning the preheat ring 604. The preheat ring 604 extends radially inward from the liner assembly 163. The preheat ring 604 is configured to be disposed around the periphery of the susceptor 602 when the susceptor 602 is in a processing position as shown in FIG. 6.

The susceptor 602 has a raised border 605 radially outwardly surrounding the pocket 603 of the susceptor 602 The raised border 605 has a top surface 607 facing the process gas region 156 of the process chamber 101. The susceptor 602 has a radially outwardly extending outer flange 614 configured to overlap a corresponding overlapping portion of the preheat ring 604 as described in more detail below. The outer flange 614 extends radially outwardly in relation to the raised border 605. A top surface 622 of the outer flange 614 is recessed below the top surface 607 of the raised border 605.

The preheat ring 604 includes a body 606 (e.g., an annular body) having a top surface 608 that is coplanar with a top surface 610 of the susceptor 602. The body 606 of the preheat ring 604 has a radially inwardly extending inner flange 612 configured to overlap the outer flange 614 of the susceptor 602. A lower surface 616 of the inner flange 612 is recessed (from below) above a lower surface 618 of the body 606. The inner flange 612 of the preheat ring 604 is disposed above the outer flange 614 of the susceptor 602 to allow the susceptor 602 to be lowered relative to the preheat ring 604 for substrate loading and unloading. As shown in FIGS. 6A and 6B, the inner flange 612 of the preheat ring 604 and the outer flange 614 of the susceptor 602 are spaced apart from one another (e.g., do not contact each other). FIG. 6A shows the susceptor 602 raised in a processing position. FIG. 6B shows the susceptor 602 lowered to a loading position.

In certain embodiments, the susceptor 602 may further include a plurality of flow conduits 609 extending through the raised border 605. Each of the plurality of flow conduits 609 may include an inlet opening 611 at a lateral surface 619 of the raised border 605 in fluid connection with an outlet opening 613 at an inner surface 615 of the raised border 605 leading into the pocket 603. In one embodiment, the outlet opening 613 of the flow conduits 609 may be disposed near a top surface 617 of the pocket 603 such that gas flowing through the outlet opening 613 is directed towards the bottom edge 111 of the substrate 108. The plurality of flow conduits 609 described herein is capable of directing gas flow from the purge gas region 158 towards portions of the substrate 108 positioned in the pocket 603 such that the flow of gas from the flow conduits 609 is sufficient to move the substrate 108 in the pocket 603. The flow of gas through the plurality of flow conduits 402 can be controlled using a feedback system communicatively coupled to the susceptor 602 and the camera 200. As discussed above, the camera 200 monitors the position of the substrate 108 within the pocket 603 and provides feedback on when misalignments of the substrate 108 on the susceptor 106 are detected and corrected.

When movement of the substrate 108 in the pocket 603 is desired (e.g. to correct a detected misalignment), the feedback system initiates auto correcting procedures in accordance with methods described herein to move the substrate 108. To move the substrate 108, the susceptor 602 is lowered (as shown in FIG. 6B) to a pre-determined centering position which enables gas from the purge gas region 158 to flow through the flow conduits 609 towards the substrate 108 in the pocket 603. In an embodiment, when lowering the susceptor 602 to the pre-determined centering position, the susceptor 602 may be lowered about 5 mm relative to the preheat ring 604. When the susceptor 602 is lowered, gas from the purge gas region 158 may flow through a vertical gap 620 between the top surface 622 of the outer flange 614 of the susceptor 602 and the lower surface 616 of the inner flange 612 of the preheat ring 604 and into the plurality of flow conduits 609. Gas flow through the flow conduits 609 described herein may be capable of lifting and moving the substrate 108 along the top surface 617 of the pocket 603 and enable movement of the substrate 108 along the horizontal X-Y plane of the pocket 603.

When the substrate 108 is determined by the feedback system to have been centered in the pocket 603, the susceptor 602 is raised to the processing position (as shown in FIG. 6A) such that the top surfaces of the susceptor 602 and the preheat ring 604 are coplanar. When the susceptor 602 is moved to the processing position, the vertical gap 620 between the top surface 622 of the outer flange 614 of the susceptor 602 is decreased such that gas flow from the purge gas region 158 is redirected upwards along the lateral surface 619 of the raised border 605 towards the process gas region 156. In the processing position, the vertical gap 620 between the top surface 622 of the outer flange 614 of the susceptor 602 and the lower surface 616 of the inner flange 612 of the preheat ring 604 is about 1 mm or less, such as about 0.5 mm to about 1 mm, such as about 0.6 mm to about 0.8 mm, such as about 0.6 mm.

FIG. 7 is a flow diagram illustrating an example method 700 for auto correcting misalignment of the substrate 108 when the substrate 108 is disposed on the example susceptor of FIG. 6, in accordance with certain embodiments of the present disclosure. The method 700 begins at 702 with detecting in a first position by the substrate 108 a misalignment of substrate 108 from a center position of the pocket 603 of the susceptor 602 in the processing system 100.

At 704, upon detection of misalignment of the substrate 108, the processing system 100 determines a recommended adjustment to correct the detected misalignment and move the substrate 108 to the center position of the pocket 603. The recommended adjustment may be determined based on the first position of the substrate 108 from which the misalignment was detected by the camera 200.

At 706, the processing system 100 provides gas flow to the susceptor 602 based on the recommended adjustment to move the substrate 108 along a horizontal X-Y plane of the pocket 404. In an embodiment, gas is provided by lowering the susceptor 602 and the substrate 108 relative to the preheat ring 604 such that gas is flowed through the plurality of flow conduits 609 in the susceptor 602 to move the substrate 108 based on the recommended adjustment.

In step 708, as gas is provided to the susceptor 602 to move the substrate 108, the position of the substrate 108 in the pocket 603 is continuously reassessed by the camera 200 to determine if the misalignment is corrected such that the substrate 108 is moved by the flow of gas through the flow conduits 609 to the center position of the pocket 603. If the substrate remains misaligned from the center of the pocket 603 such that the current flow of gas provided in step 706 through the plurality of flow conduits 609 is no longer consistent with the recommended adjustment based on a second misaligned position of the substrate 108 detected by the camera 200, steps 704 and 706 are repeated with a new recommended adjustment being determined based on the second misaligned position of the substrate 108 and gas flow through the plurality of flow conduits 609 being modified and provided in 706 based on the new recommended adjustment for the second misaligned position of the substrate 108.

If the misalignment of the substrate 108 is determined by to have been corrected in step 708 such that the substrate 108 is moved to a new position corresponding with the center position of the pocket 603, in 710, the flow of gas to the susceptor 602 is stopped to allow the substrate 108 to set in the new position in the pocket 603 corresponding with the center position. In an embodiment, the flow of gas to the pocket 603 of the susceptor 602 may be ceased by raising the susceptor 602. In one embodiment, the susceptor 602 is raised to the processing position and gas flow to the flow conduits 609 is redirected and thereby stopped. The stopping of the flow of gas in step 710 then allows the substrate 108 to set in its new position in the pocket 603.

Figures 8A, 8B:
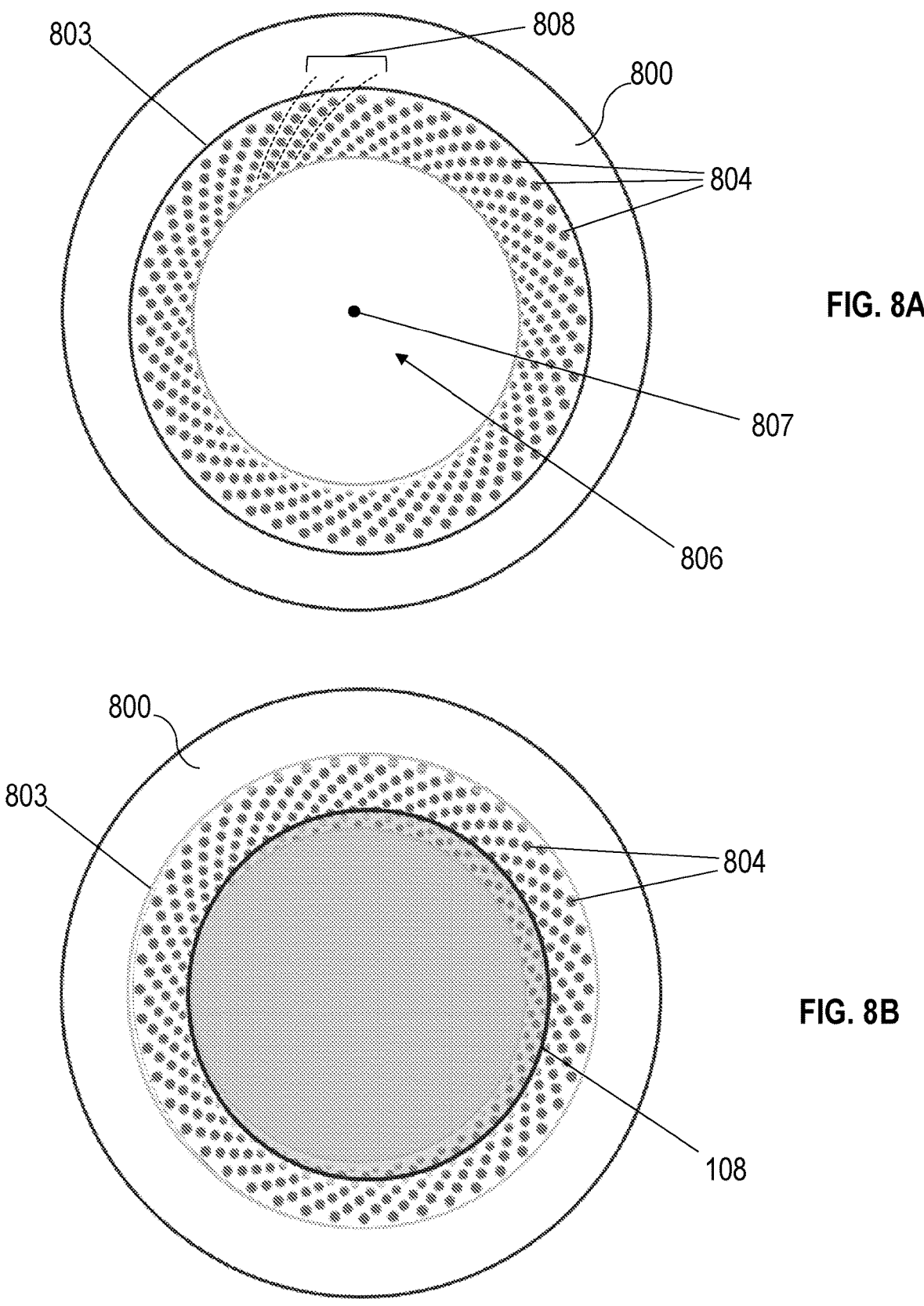
FIGS. 8A and 8B are schematic diagram showing an example susceptor that may be used in the processing system of FIG. 2A, in accordance with certain embodiments of the present disclosure.

FIGS. 8A and 8B show schematic top view drawings of an example susceptor 800 that may be used in the processing system of FIG. 2A, in accordance with certain embodiments of the present disclosure.

In the embodiment shown in FIG. 8A, the susceptor 800 may include a plurality of flow conduits with a plurality of outlet openings 804 disposed on a top surface 806 of a pocket 803 of the susceptor 800 in a spiral pattern. Each of the outlet openings 804 and corresponding flow conduits may allow gas to flow from the purge gas region 158 of the chamber volume 123 into the pocket 803 of the susceptor 800. With the exception of the patterned arrangement of openings 804, the susceptor 800 shown in FIGS. 8A and 8B may generally be formed similar to the example susceptor 400 shown in FIG. 4. As such, each of the outlet openings 804 in the plurality of flow conduits extend through the susceptor 800 to corresponding inlet openings on the bottom surface of the susceptor 800.

As shown, the varying outlet openings 804 of each of the respective plurality of flow conduits in the susceptor 800 is configured to provide varying flows of gas to different portions of the susceptor 800 and any substrate 108 therein (when disposed on the susceptor 800). In addition to the spiral patterned arrangement of the outlet openings 804 of the plurality of flow conduits, in another embodiment, the diameter of the plurality of outlet openings 804 may also vary and are larger for outlet openings 804 closer to the circumferential edge of the pocket 803, when compared to outlet openings 804 closer to a center region 807 of the pocket 803 of the susceptor 800. In the example shown, the spiral pattern of outlet openings 804 may therefore be formed with arrangements of multiple intertwined lines 808 of outlet openings 804 radiating from the center region 807 of the pocket 803 of the susceptor 800. In each of the radiating lines 808 the plurality of outlet openings 804 may be formed with the diameter the plurality of outlet openings 804 increasing from the center region 807 of the pocket 803 toward the outer edge of the pocket 803.

When positioning the substrate 108 on the susceptor 800 in the chamber volume 123 for processing, the substrate 108 may generally be positioned and centered in the pocket 803 over the center region 807. However, when the substrate 108 is misaligned in the pocket 803, the substrate 108 becomes misaligned with respect to the center region 807. When such misalignment is detected by the camera 200, the feedback system may initiate one of the method as described herein to automatically move the substrate 108 and correct the misalignment without user intervention. With respect to the susceptor 800, the auto correcting of the misalignment includes flowing gas through the plurality of flow conduits to lift and reposition the substrate 108 over the center region 807 of the pocket 803.

The varying diameters of the outlet openings 804 of the plurality of flow conduits between the center region 807 and the edge of the pocket 803 may provide for different flow rates of gas through some of the openings 804 as compared to others when gas is provided and the flow conduits are in use. Varying diameter of the outlet openings 804 may allow for varying the flow rate of gas to certain portions of the pocket 803 near the edge of the susceptor 800. In some embodiments, increasing the flow rate of gas through openings 804 near the edge of the pocket 803 may enable more gas flow to assist in lifting the substrate 108 disposed over such openings 804.

As shown in FIG. 8B, the spiral pattern design and increased diameter of the plurality of outlet openings 804 near the outer edge of the pocket 803 allow for greater flow of gas to specific misaligned portions of the substrate 108 when the substrate 108 is disposed on the susceptor 800 and misaligned relative to the center region 807. As shown in FIG. 8B, portions of the substrate 108 misaligned relative to the center region 807 will tend to be disposed over both more and larger outlet openings 804 in the susceptor 800 when compared to portions of the substrate 108 over the center region 807 and/or portions opposite of misaligned portions that are closer to the center region 807 in response to being opposite to corresponding misaligned portions. The greater the misalignment of the substrate 108, the more the substrate 108 may be disposed over a greater number of outlet openings 804.

With misaligned portions of the substrate 108 disposed over more flow conduits 802 and larger outlet openings 804, the susceptor 800 allows for the feedback system to provide more gas flow to specifically lift and move the misaligned portions of the substrate 108.

While the foregoing is directed to embodiments of the present disclosure, other and further embodiments of the disclosure may be devised without departing form the basic scope thereof, and the scope thereof is determined by the claims that follow.

What is claimed is:

1. A processing system for auto centering substrates in a process chamber, comprising:
a process chamber comprising a substrate support disposed within a chamber volume of the process chamber, the substrate support comprising a pocket for receiving a substrate, and the process chamber comprising a base ring disposed between an upper dome and a lower dome;
a plurality of flow conduits extending between a top surface of the pocket of the substrate support and a bottom surface of the substrate support;
a purge gas inlet formed in a sidewall of the base ring, the purge gas inlet is disposed at an elevation below the substrate support and configured to direct a gas to flow across the bottom surface of the substrate support; and
an imaging device coupled to the process chamber and configured to monitor a position of the substrate in the pocket of the substrate support; and wherein:
each of the plurality of flow conduits comprises an outlet opening formed in the top surface of the pocket, wherein the outlet openings of the plurality of flow conduits are formed between a center region of the pocket and a circumferential edge of the pocket; and
each of the outlet openings of the plurality of flow conduits comprises a diameter and wherein the diameter of the outlet openings closer to the center region of the pocket is smaller than the diameter of the outlet openings farther from the center region.

2. The processing system of claim 1, wherein each of the plurality of flow conduits further comprises a flow valve for controlling flow of gas through the plurality of flow conduits.

3. The processing system of claim 1, wherein the imaging device is configured to detect a misalignment of the substrate relative to a center position of the pocket of the substrate support.

4. The processing system of claim 1, wherein each of the plurality of flow conduits is configured to direct gas flow from the chamber volume to the top surface of the pocket.

5. The processing system of claim 1, wherein the outlet openings of the plurality of flow conduits are disposed in a spiral pattern on the top surface of the pocket.

6. The processing system of claim 1, further comprising a controller communicatively coupled to the imaging device and the substrate support, wherein the controller is configured to provide flow of gas through at least some of the plurality of flow conduits in response to detection by the imaging device of a misalignment of the substrate in the pocket of the substrate support.

7. The processing system of claim 1, further comprising a CPU communicatively coupled to the imaging device and configured to provide instructions for a recommended adjustment in response to detection of a misalignment of the substrate by the imaging device, wherein the recommended adjustment corrects the misalignment of the substrate detected by the imaging device.

8. The processing system of claim 7, further comprising a controller communicatively coupled to the imaging device and the substrate support, wherein the controller is configured to provide flow of gas through at least at least some of the plurality of flow conduits to move the substrate based on the instructions for the recommended adjustment.

9. A processing system for auto centering substrates in a process chamber, comprising:
a process chamber comprising a susceptor and a preheat ring disposed within a chamber volume of the process chamber, wherein the process chamber comprises a base ring disposed between an upper dome and a lower dome, wherein the susceptor comprises a pocket for receiving a substrate, and wherein the preheat ring radially overlaps the susceptor;
a plurality of flow conduits extending through portions of the susceptor and between a bottom surface of the susceptor and a top surface of the pocket;
a purge gas inlet formed in a sidewall of the base ring, the purge gas inlet is disposed at an elevation below the susceptor and configured to direct a gas to flow across the bottom surface of the susceptor; and
an imaging device coupled to the process chamber and configured to monitor a position of the substrate in the pocket of the susceptor; and wherein:
each of the plurality of flow conduits comprises an outlet opening formed in the top surface of the pocket, wherein the outlet openings of the plurality of flow conduits are formed between a center region of the pocket and a circumferential edge of the pocket; and
each of the outlet openings of the plurality of flow conduits comprises a diameter and wherein the diameter of the outlet openings closer to the center region of the pocket is smaller than the diameter of the outlet openings farther from the center region.

10. The processing system of claim 9, wherein a portion of the preheat ring is disposed above and radially overlapping a portion of the susceptor.

11. The processing system of claim 9, wherein each the plurality of flow conduits is configured to flow gas from the chamber volume into the pocket of the susceptor when the susceptor is lowered relative to the preheat ring.

12. The processing system of claim 9, further comprising a controller communicatively coupled to the imaging device and the susceptor, wherein the controller is configured to lower the susceptor relative the preheat ring in response to detection by the imaging device of a misalignment of the substrate in the pocket of the susceptor.

13. The processing system of claim 9, further comprising a CPU communicatively coupled to the imaging device, wherein the CPU is configured to provide instructions for a recommended adjustment in response to detection of a misalignment of the substrate by the imaging device, wherein the recommended adjustment corrects the misalignment of the substrate detected by the imaging device.

14. The processing system of claim 9, wherein each of the plurality of flow conduits further comprises a flow valve for controlling flow of gas through the plurality of flow conduits.

15. The processing system of claim 9, wherein the imaging device is configured to detect a misalignment of the substrate relative to a center position of the pocket of the susceptor.

16. The processing system of claim 9, wherein each of the plurality of flow conduits is configured to direct gas flow from the chamber volume to the top surface of the pocket.

17. The processing system of claim 9, wherein the outlet openings of the plurality of flow conduits are disposed in a spiral pattern on the top surface of the pocket.

* * * * *